United States Patent
Tanamoto et al.

(10) Patent No.: US 7,949,984 B2
(45) Date of Patent: May 24, 2011

(54) METHOD AND APPARATUS FOR DESIGNING A THREE-DIMENSIONAL INTEGRATED CIRCUIT

(75) Inventors: Tetsufumi Tanamoto, Kawasaki (JP); Shinichi Yasuda, Kawasaki (JP); Shinobu Fujita, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 515 days.

(21) Appl. No.: 12/047,547

(22) Filed: Mar. 13, 2008

(65) Prior Publication Data

US 2008/0244489 A1    Oct. 2, 2008

(30) Foreign Application Priority Data

Mar. 26, 2007   (JP) ................. 2007-079967

(51) Int. Cl.
*G06F 17/50* (2006.01)
(52) U.S. Cl. .............................. 716/124; 716/125
(58) Field of Classification Search .............. 716/8, 124, 716/125
See application file for complete search history.

(56) References Cited

U.S. PATENT DOCUMENTS

| | | | |
|---|---|---|---|
| 7,721,232 B2 * | 5/2010 | Ejury ................. | 716/2 |
| 2005/0170600 A1 * | 8/2005 | Fukuzo .............. | 438/396 |
| 2006/0168551 A1 * | 7/2006 | Mukuno ............ | 716/5 |
| 2008/0211540 A1 | 9/2008 | Fujita ................ | 326/47 |

FOREIGN PATENT DOCUMENTS

| | | |
|---|---|---|
| JP | 9289253 | 11/1997 |
| JP | 2863613 | 12/1998 |
| JP | 2000243876 | 9/2000 |
| JP | 2007-250754 | 9/2007 |

OTHER PUBLICATIONS

U.S. Appl. No. 11/860,102, dated Sep. 24, 2007, Shinobu Fujita.
Takahasha, et al., "Current Status of Resedarch and Development for Three-Dimensional Chip Stack Technology", Jpn. J. Appl. Phys., Vol. 40, Apr. 2001, pp. 3032-3037.
Official action dated Feb. 24, 2009 for corresponding Japanese application No. 2007-079967 (with English translation).

* cited by examiner

*Primary Examiner* — Jack Chiang
*Assistant Examiner* — Brandon W Bowers
(74) *Attorney, Agent, or Firm* — Ohlandt, Greeley, Ruggiero & Perle, L.L.P.

(57) ABSTRACT

A method of designing a three-dimensional integrated circuit includes dividing two-dimensional layout data of a circuit formed on a semiconductor substrate into a plurality of layout block data in order to re-arrange in different layers, generating layout block data reversing one of the layout block data of two folded layers arranged vertically adjacent to each other, alternately arranging the reversed layout block data and non-reverse block layout data to form a plurality of layers vertically overlapped, selecting at least one from interconnects included in a plurality of layout block data of the circuit and ranging over plural layers so as to be mutually and functionally collected together with respect to at least one of time delay, interconnect length and block configuration, and re-arranging the selected interconnect using a via connecting an upper layer and an under layer of the folded interconnect.

16 Claims, 14 Drawing Sheets

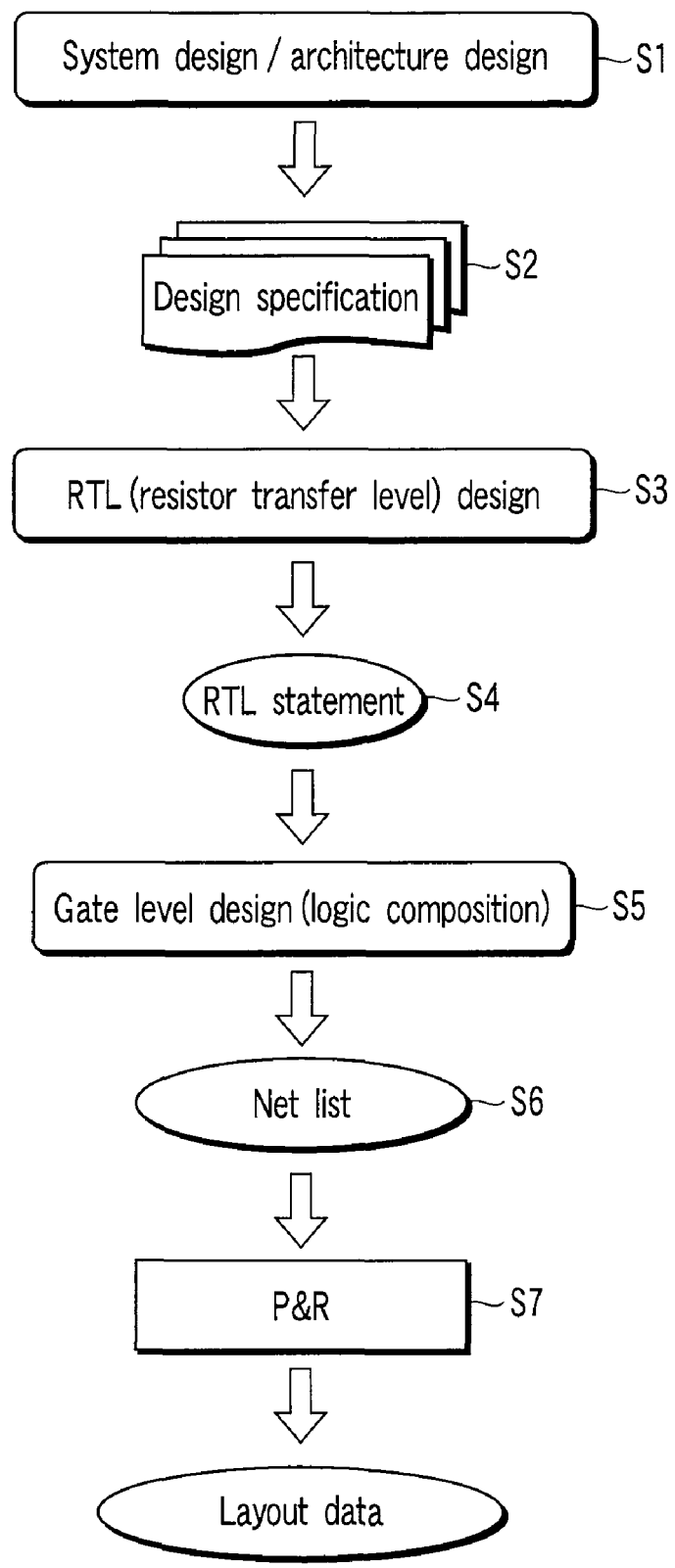
F I G. 2

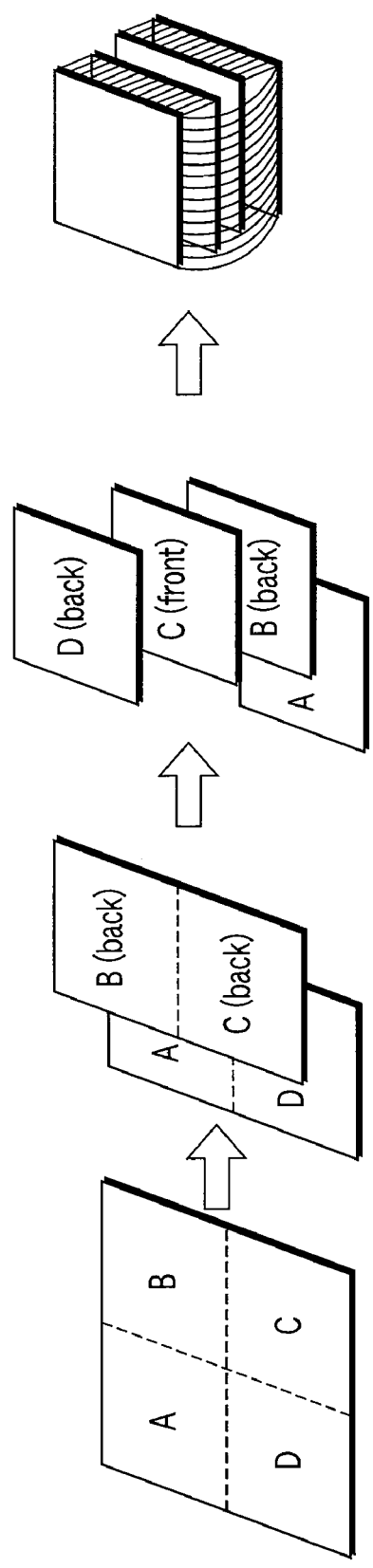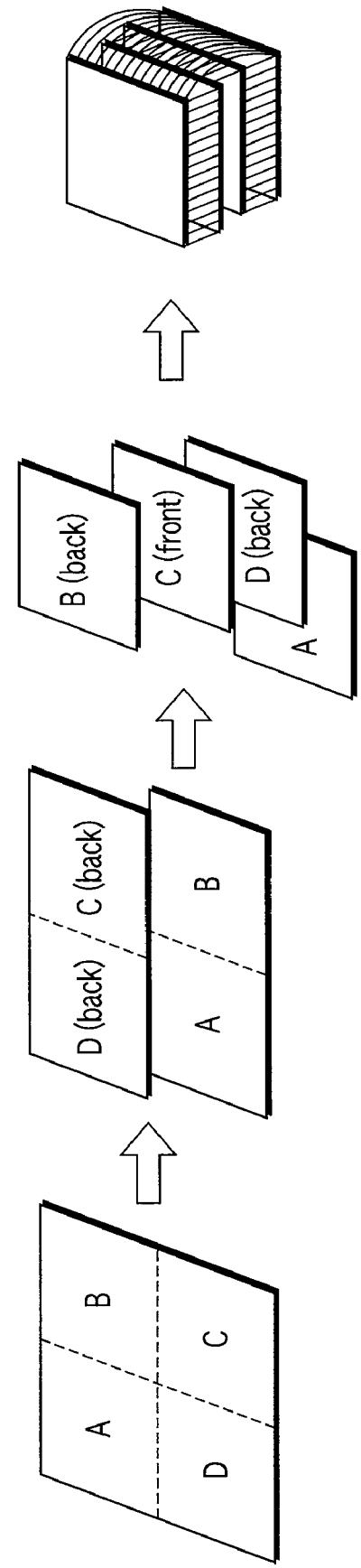

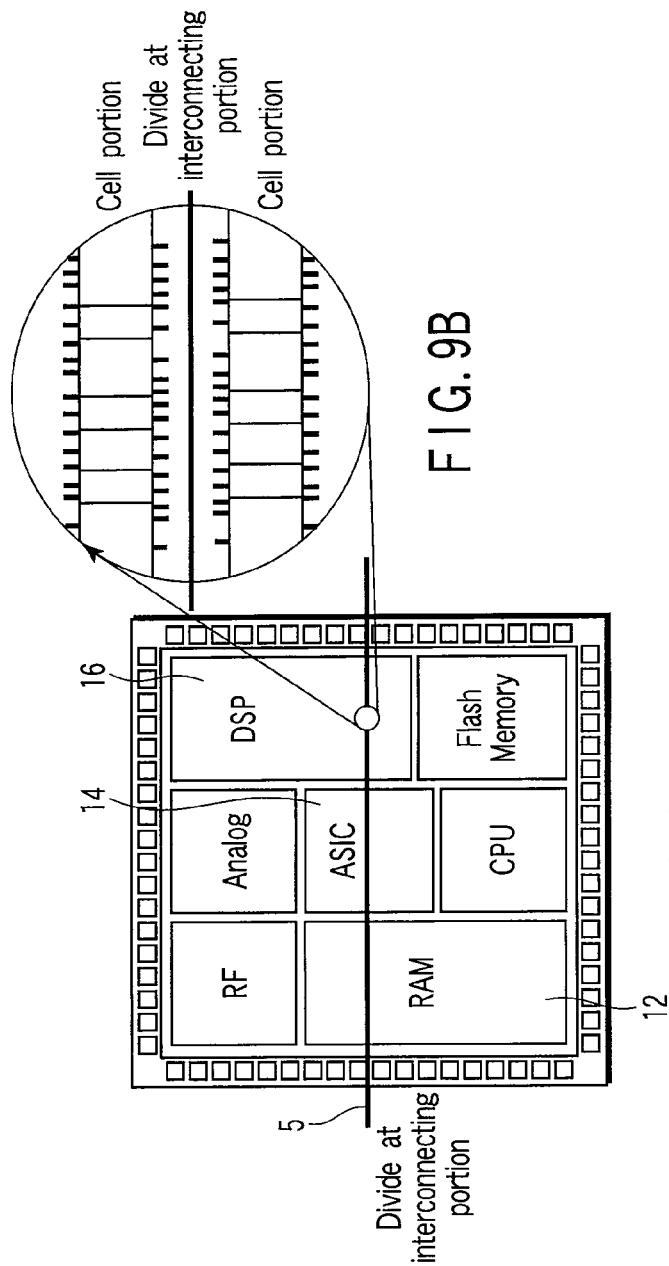
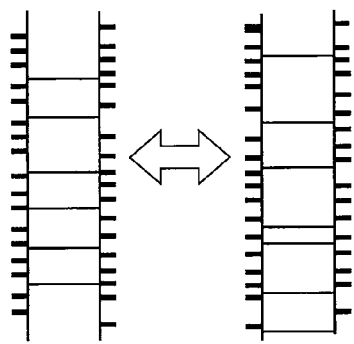
FIG. 9A
FIG. 9B
FIG. 9C

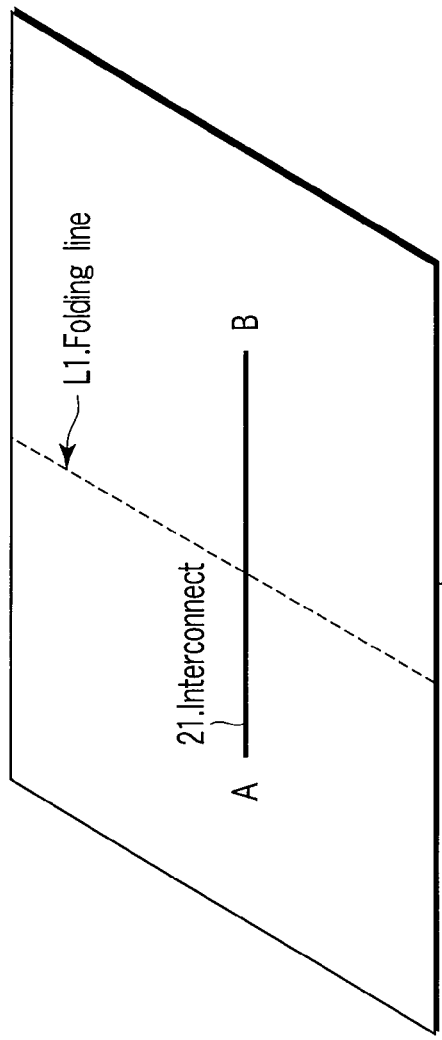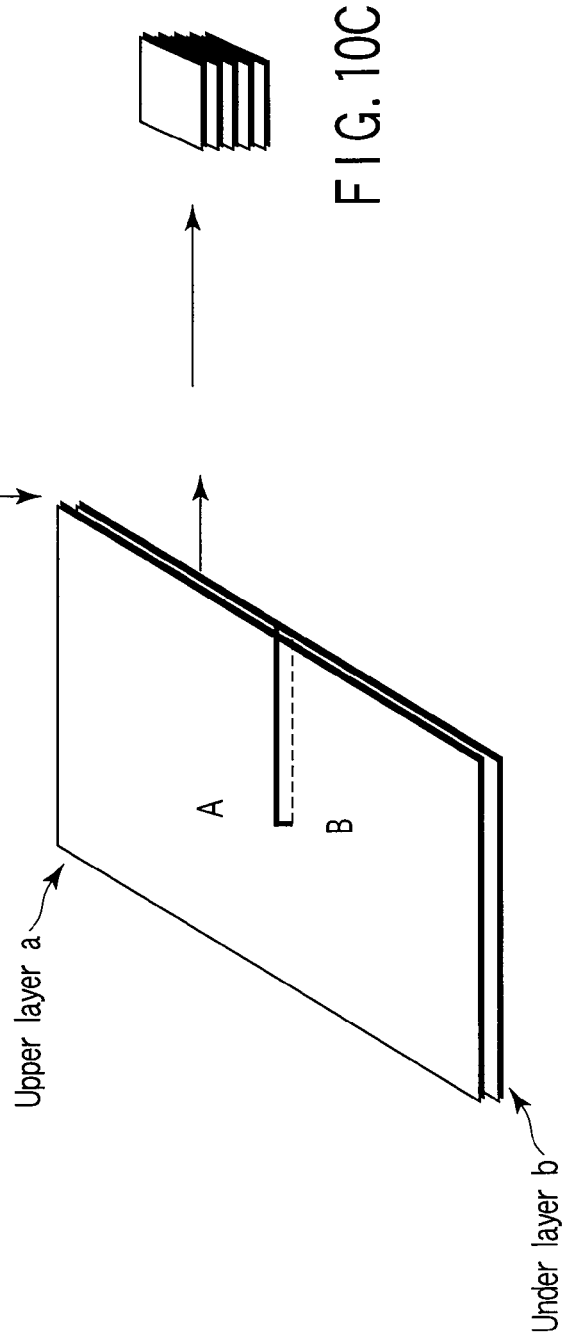

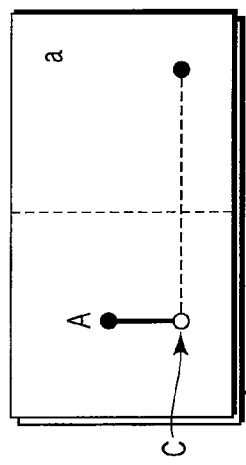
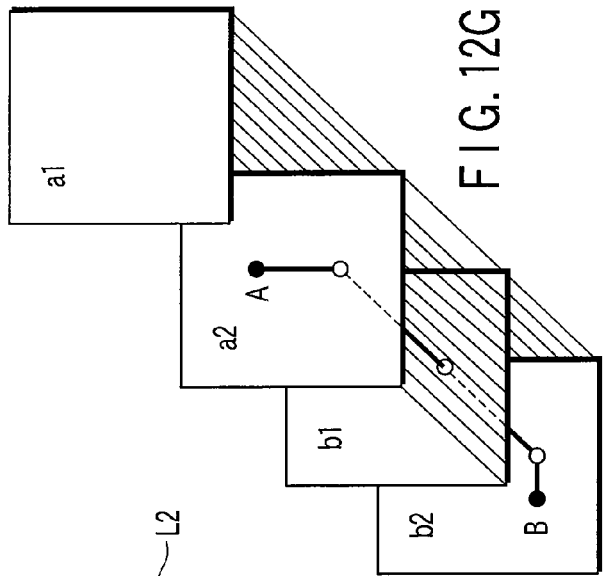
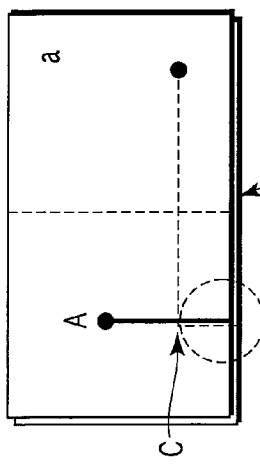
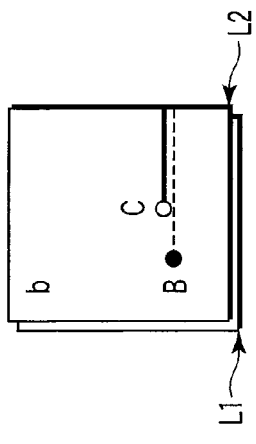
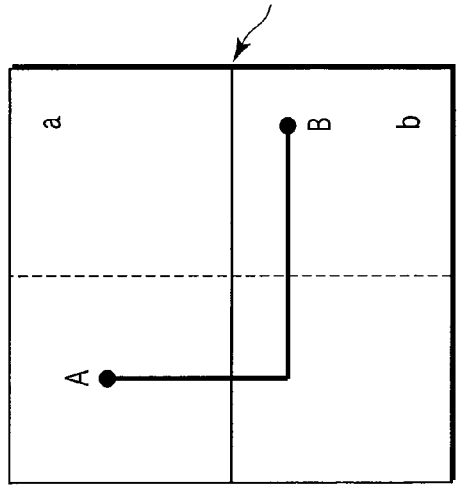
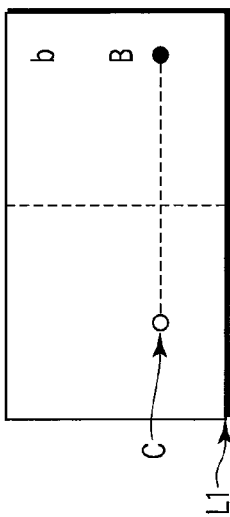

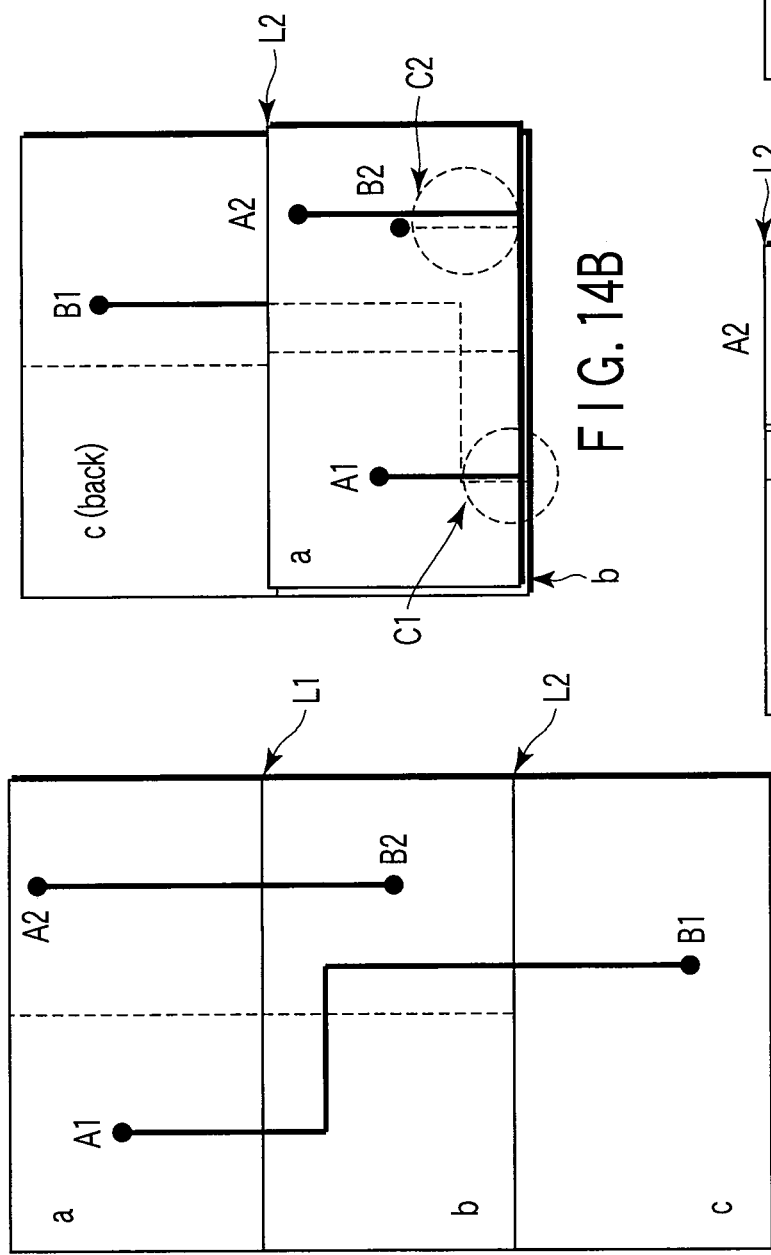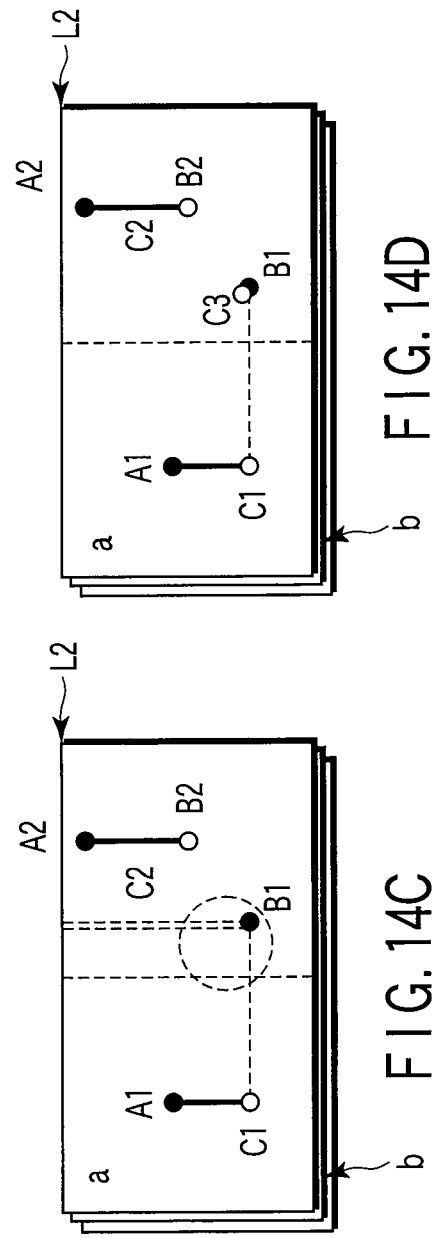

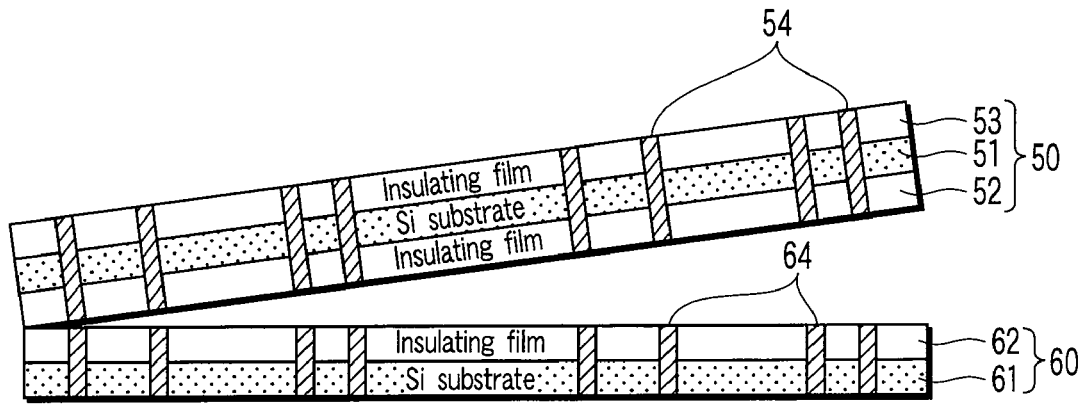
F I G. 16A
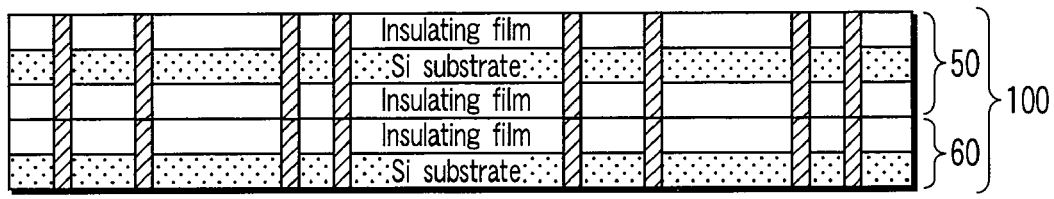
F I G. 16B
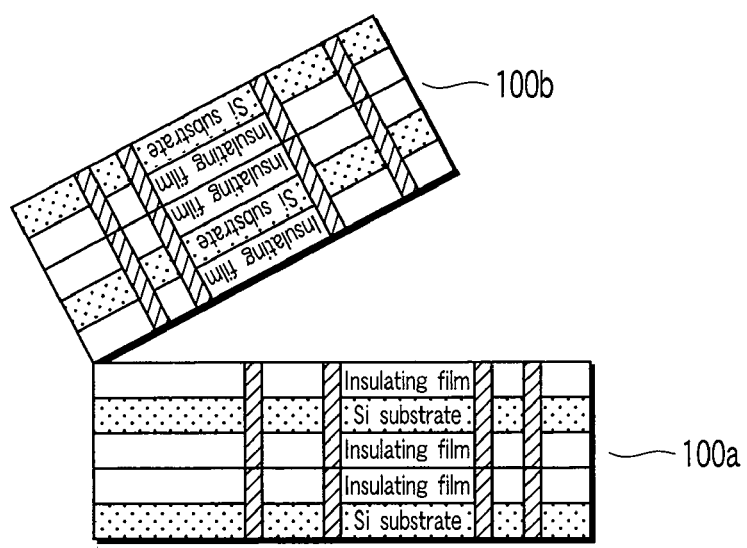
F I G. 16C

US 7,949,984 B2

METHOD AND APPARATUS FOR DESIGNING A THREE-DIMENSIONAL INTEGRATED CIRCUIT

CROSS-REFERENCE TO RELATED APPLICATIONS

This application is based upon and claims the benefit of priority from prior Japanese Patent Application No. 2007-079967, filed Mar. 26, 2007, the entire contents of which are incorporated herein by reference.

BACKGROUND OF THE INVENTION

1. Field of the Invention

The present invention relates to method and apparatus for designing a three-dimensional integrated circuit formed in such a manner that a semiconductor circuit is laid out on a plurality of stacked layers.

2. Description of the Related Art

In recent years, the Si substrate via (vertical interlayer interconnect) technique has been proposed (see, e.g., Japanese Patent No. 2863613). According to the technique, wirings between a plurality of stacked chips are made by the Si substrate vias formed in a substrate, instead of bonding wires. The Si substrate vias can make conduction paths between a plurality of stacked substrates, so that a two-dimensional chip area is largely reduced.

The use of the foregoing Si substrate via can realize a stacked module of system LSIs, including memories, such as SRAM and DRAM, and a processor. Therefore, interconnect delay can be greatly reduced. A via diameter of a through-hole for forming the Si substrate via is reduced to fall in a range from several μm to several tens of μm. As a result, several thousands to several ten thousands of substrate via are formed in the whole chip.

On the other hand, according to a conventional circuit layout design system, circuits are merely laid out two-dimensionally. For this reason, in order to form a three-dimensional circuit layout using via, a circuit layout design system adaptable to the three-dimensional circuit layout must be developed. This is a factor of requiring huge cost and much time. In particular, the three-dimensional circuit layout must be optimized to develop an application-specific integrated circuit (ASIC). Thus, cost and time are further taken to develop the circuit layout design system. Moreover, according to the foregoing Patent Publication, routing between surfaces three-dimensionally laid is manually done. For this reason, design is troublesome, and the design cost increases.

In order to solve the foregoing problem, it is desired to realize a new method and apparatus for designing a three-dimensional integrated circuit, using conventional two-dimensional layout data. Specifically, the design cost and time are economized, and a long interconnecting portion is reduced, and thereby, it is possible to design a three-dimensional integrated circuit having excellent performance.

BRIEF SUMMARY OF THE INVENTION

According to a first aspect of the invention, there is provided a method of designing a three-dimensional integrated circuit, which includes:

dividing two-dimensional layout data of a circuit formed on a semiconductor substrate into a plurality of layout block data in order to re-arrange in different layers;

generating layout block data reversing one of the layout block data of two layers arranged vertically adjacent to each other;

alternately arranging the reversed layout block data and non-reverse block layout data to form a plurality of layers vertically overlapped;

selecting at least one from interconnects included in a plurality of layout block data of the circuit and ranging over plural layers so as to be mutually and functionally collected together with respect to at least one of time delay, interconnect length and block configuration; and re-arranging the selected interconnect using a via connecting an upper layer and an under layer of the interconnect.

According to a second aspect of the invention, there is provided an apparatus for designing a three-dimensional integrated circuit, which includes:

a block dividing part dividing two-dimensional layout data of a circuit to be formed on a semiconductor substrate into a plurality of layout block data in order to re-arrange in different layers;

a reverse data generation part generating reverse layout block data by reversing one of the layout block data of two layers arranged vertically adjacent to each other;

a three-dimensional layout generation part alternately stacking the plurality of layout block data divided by the block dividing part and the reverse layout block data generated by the reverse data generation part to a plurality of vertically overlapped layers; and a re-arrangement part selecting at least one from interconnects which are included in a plurality of layout block data of the circuit and which range over plural layers so as to mutually and functionally collect together with respect to at least one of time delay, interconnect length and block configuration, and short-circuiting the selected interconnect using a via connecting an upper layer and an under layer of the selected interconnect.

BRIEF DESCRIPTION OF THE SEVERAL VIEWS OF THE DRAWING

FIG. 2 is a flowchart to explain the procedures in the first embodiment;

FIGS. 7A to 7D are view showing a state that four layout block data A, B, C and D of two-dimensional layout data are stacked in the order of A→B→C→D;

FIGS. 8A to 8D are view showing another state that four layout block data A, B, C and D of two-dimensional layout data are stacked in the order of A→B→C→D;

FIGS. 9A to 9C are views showing a manner that functional block is divided using an interconnecting portion of a standard cell as a boundary;

FIGS. 10A to 10C are views to explain a second embodiment, and views showing via layout positions when the layout data A and B are folded in two;

FIGS. 12A to 12G are views to explain a fourth embodiment, and views showing via layout positions when the layout data A and B are folded in four;

FIGS. 14A to 14D are views to explain a sixth embodiment, and views showing via layout positions when the layout data A and B are folded in three;

FIGS. 16A to 16C are views to explain an eighth embodiment, and to show folding and bonding of substrates having vias.

DETAILED DESCRIPTION OF THE INVENTION

According to embodiments of the present invention described hereinafter, three-dimensionally arrangeable layout block data is created from two-dimensional layout data. In particular, long delay or interconnect length is re-arranged through vias connecting upper and under layers. This serves to economize design cost and time, and a three-dimensional integrated circuit having excellent performance is designed. In addition, long interconnects are reduced.

Various embodiments of the present invention will be described in detail with reference to the accompanying drawings.

First Embodiment

Figure 1:
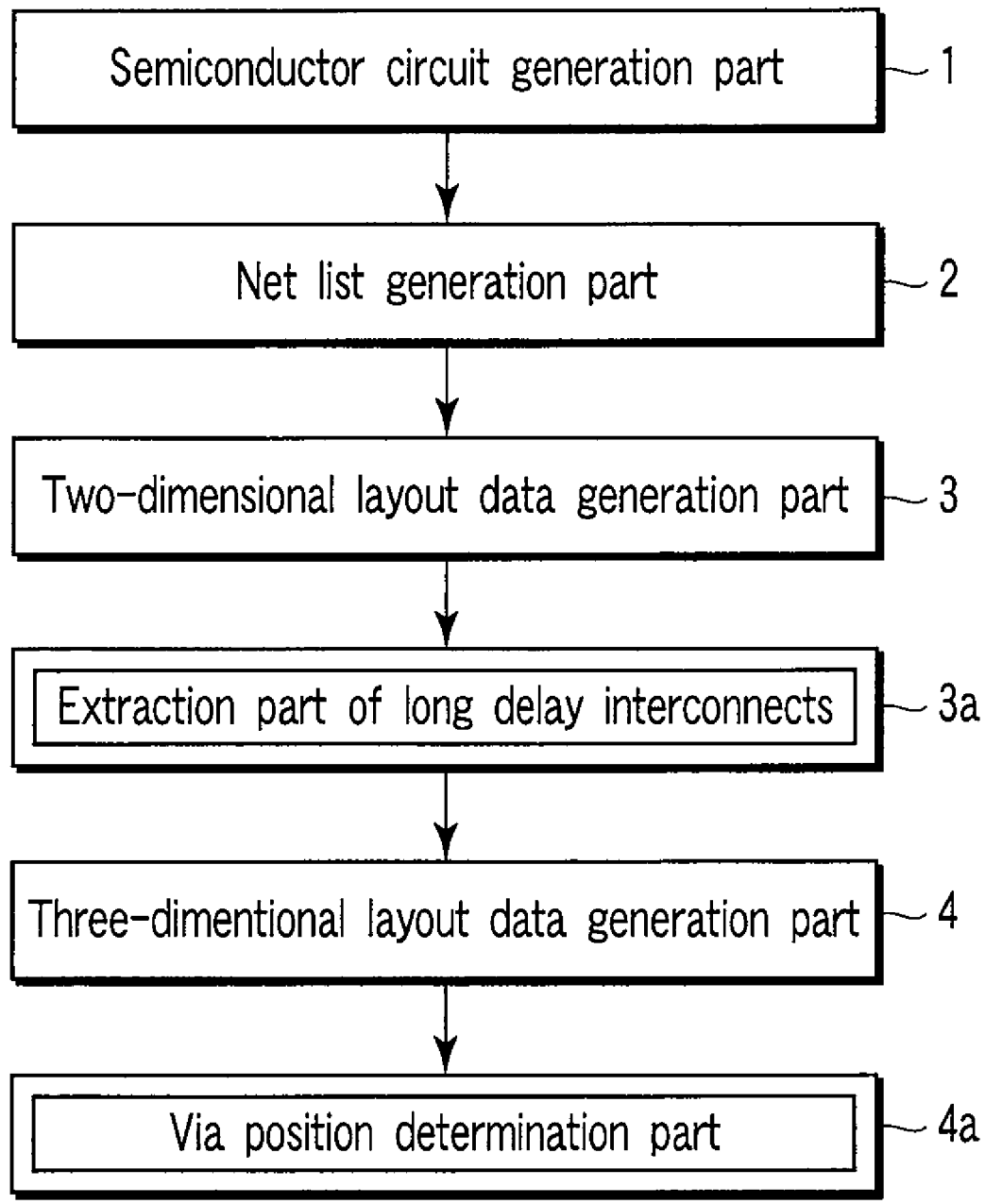
FIG. 1 is a block diagram schematically showing the configuration of a three-dimensional integrated circuit design apparatus according to a first embodiment.

FIG. 1 is a block diagram schematically showing the configuration of a three-dimensional integrated circuit design apparatus according to a first embodiment.

The apparatus includes a semiconductor circuit generation part 1, a net list generation part 2, and a two-dimensional layout generation part 3. The apparatus further includes an extraction part 3a of long delay interconnects, a three-dimensional layout generation part 4, and a via position determination part 4a.

The configuration, which does not include the extraction part 3a of long delay interconnects and the three-dimensional layout generation part 4, is disclosed in a prior application (Jpn. Pat. Appln. KOKAI Publication No. 2007-250754) previously filed by the inventors. First, the prior application will be hereinafter described.

The semiconductor circuit generation part 1 describes resistor transfer level (RTL) according to a design specification. The description method of the semiconductor circuit is not specially limited to RTL, and other description method may be used. The net list generation part 2 makes logic synthesis based on the RTL description to generate a net list showing circuit connection information. The two-dimensional layout data generation part 3 makes placement & routing (P & R) based on the net list to generate two-dimensional layout data.

Various processings of the semiconductor circuit generation part 1, the net list generation part 2 and two-dimensional layout data generation part 3 are carried out in the following manner. Usually, a dedicated CAD tool boots on a computer, and software processing is carried out. In this case, each processing may be carried out using dedicated hardware. FIG. 2 is a flowchart to explain the procedure of the semiconductor circuit generation part 1, the net list generation part 2 and two-dimensional layout data generation part 3.

First, a system design and an architecture design are made (step S1). A design specification is prepared (step S2). The procedures of steps S1 and S2 may be done using dedicated tool, or a designer may manually makes a design.

The semiconductor circuit generation part 1 makes a RTL design based on the design specification (step S3), and thereafter, creates RTL statement (step S4). The net list generation part 2 makes a gate level design (logic composition) (step S5) to generate a net list (step S6).

Based on the net list, the two-dimensional layout data generation part 3 generates two-dimensional layout data (step S7). Thereafter, based on the two-dimensional layout data, the three-dimensional layout data generation part 4 generates three-dimensional layout data described later in detail.

Figure 3:
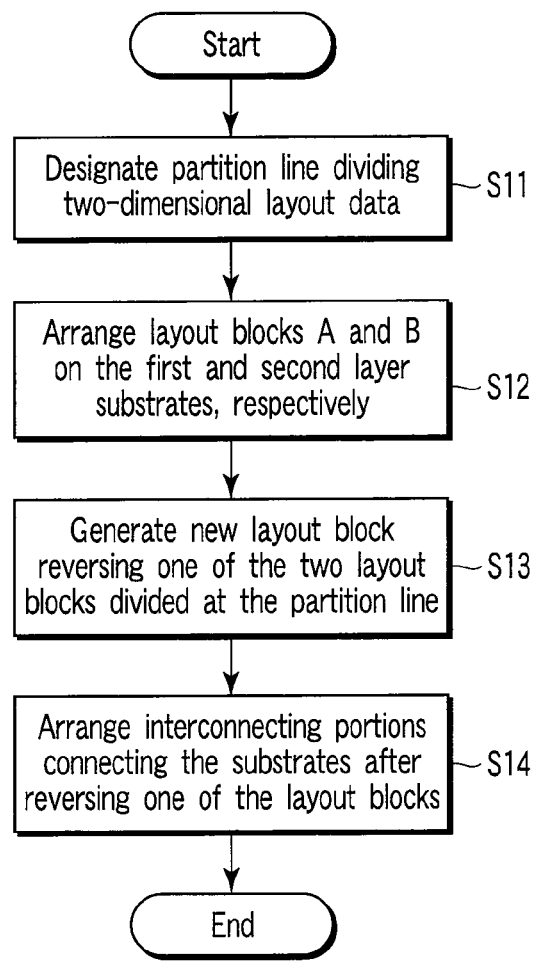
FIG. 3 is a flowchart to explain the procedures in the first embodiment.

FIG. 3 is a flowchart to explain the procedure taken by the three-dimensional layout data generation part 4.

Figure 4A:
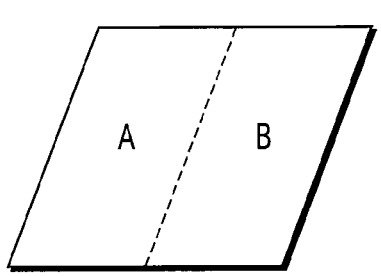
FIG. 4A is a view schematically showing a manner that two-dimensional layout data is divided into two layout block data A and B.
Figure 4B:
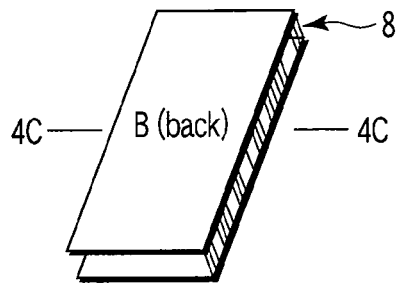
FIG. 4B is a view schematically showing a manner that the foregoing two layout block data A and B overlap each other into two layers.
Figure 4C:
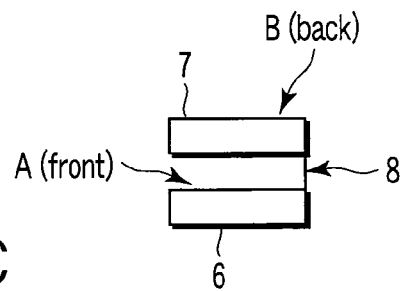
FIG. 4C is a cross-sectional view taken along the line 4C-4C of FIG. 4B.
Figure 5B:
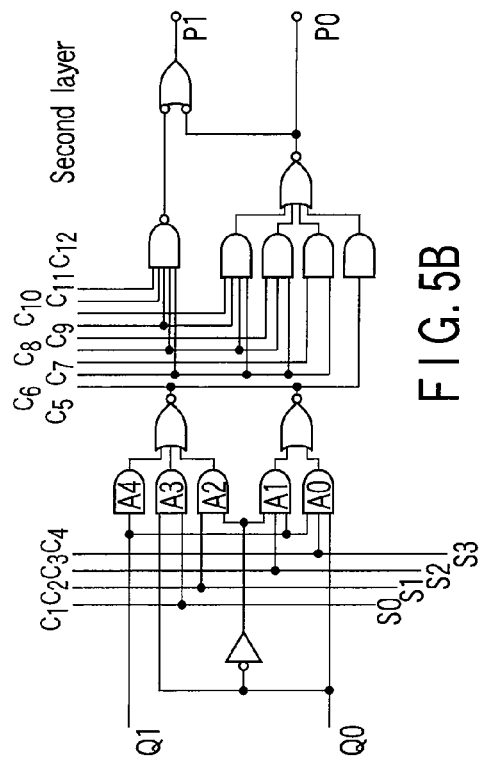
FIG. 5B is a circuit diagram reversing the second layer.
Figure 5C:
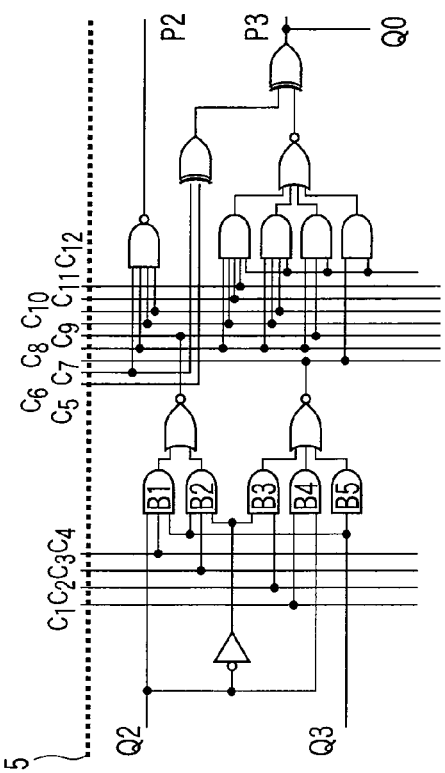
FIG. 5C is a circuit diagram showing the first layer.
Figure 5A:
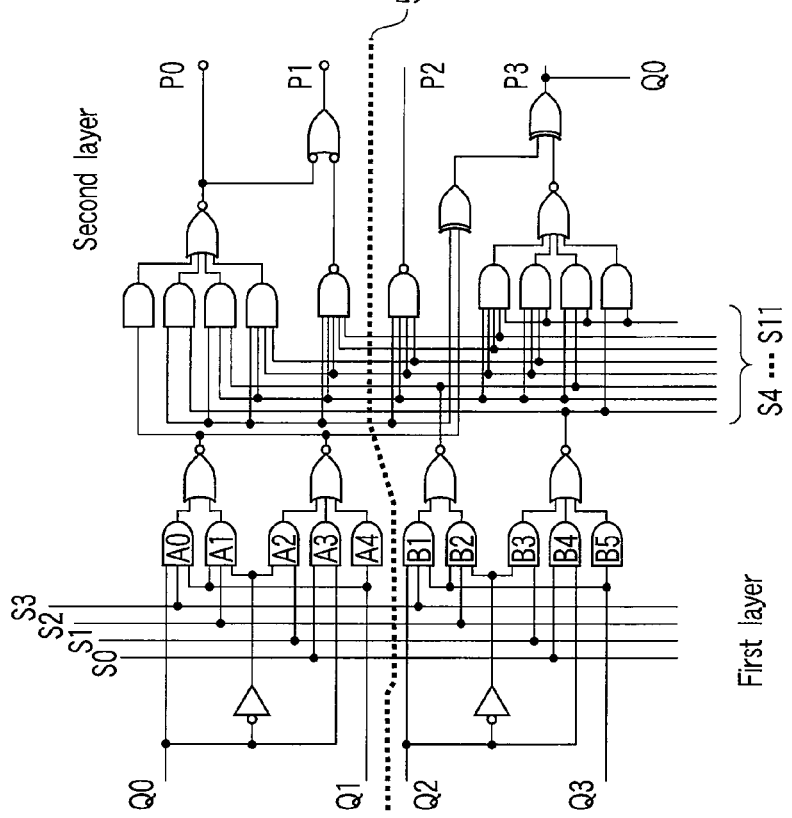
FIG. 5A is a view showing a circuit corresponding to FIG. 4A in a state that the circuit is divided into first and second layers using a dotted line as a boundary.

FIGS. 4A to 4C are view showing a manner that two-dimensional layout data is divided into two layout block data A and B, and overlap each other in two layers. FIGS. 5A to 5C are circuit diagrams corresponding to FIGS. 4A to 4C. The operation of the three-dimensional layout data generation part 4 will be hereinafter described based on the flowchart of FIG. 3 and with reference to FIGS. 4A to 5C.

A location dividing two-dimensional layout data is set (step S11). In FIG. 4, the two-dimensional layout data is divided into two layout block data, that is, A and B. The layout block data A corresponds to a circuit positioned at the lower side from the dotted line (partition line 5) of FIG. 5A. The layout block data B corresponds to a circuit positioned at the upper side from the partition line 5.

The layout block data A is arranged on a first layer substrate, and the layout block data B is arranged on a second layer substrate (step S12).

The partition line 5 between layout block data A and B is arranged so that global interconnects are divided into global interconnecting parts in the circuit. In this case, the global interconnects mean interconnects shared by a plurality of layout block data. For example, the global interconnects are signal lines S0 to S3 and signal lines S4 to S11 in FIG. 5A. Moreover, the partition line 5 is arranged so that local interconnects in plural layout block data are not divided.

The circuit is provided with the global interconnects and local interconnects. The global interconnects make a connected between a plurality of layout blocks. The local interconnects make a connection between cells in each layout block. In order to identify whether interconnects in the two-dimensional layout data are global interconnects or local interconnects, attention is given to each functional block in the two-dimensional layout data.

Figure 6:
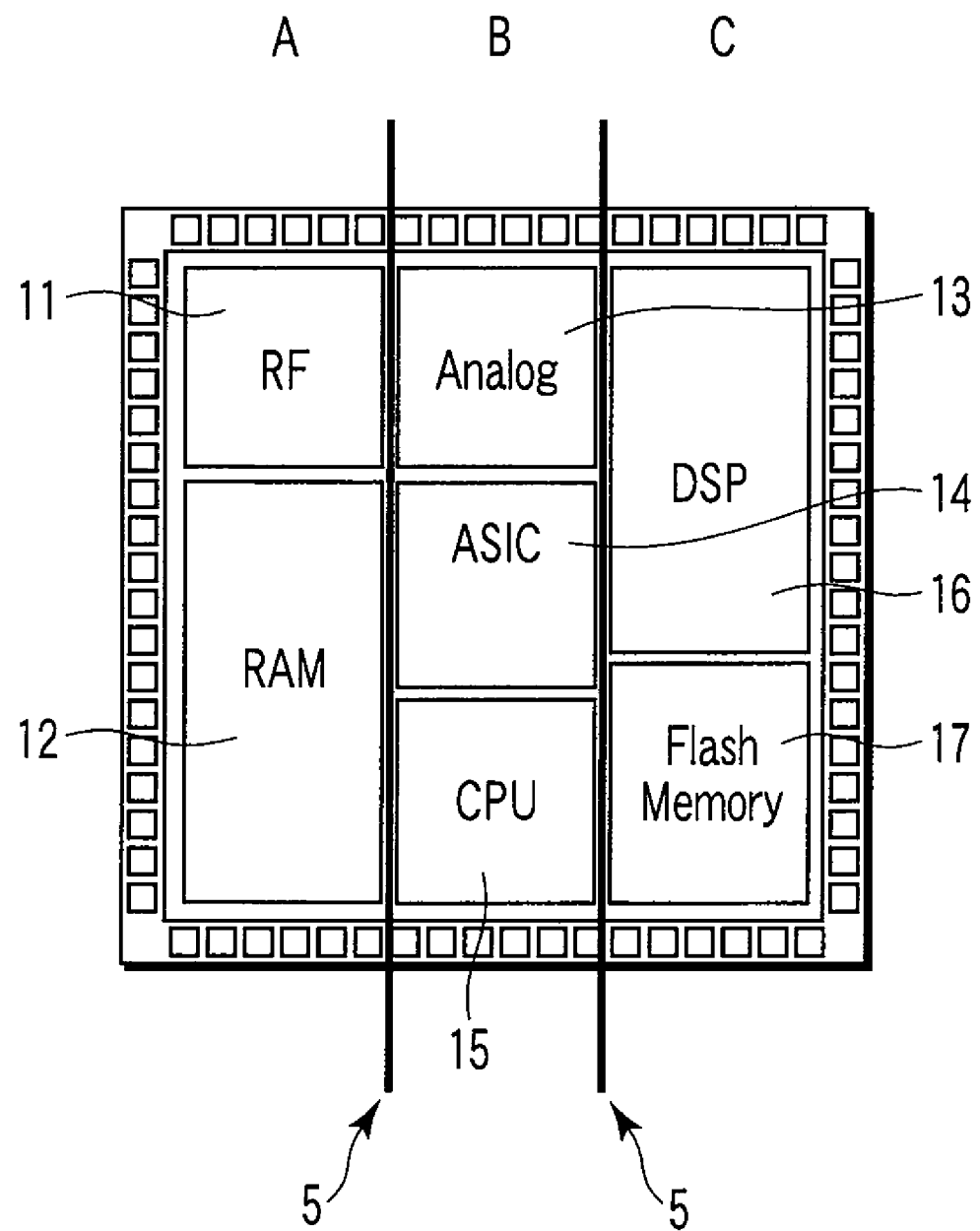
FIG. 6 is a view showing a two-dimensional layout of an integrated circuit including some functional blocks.

FIG. 6 is a view showing one example of functional blocks in the two-dimensional layout data. The two-dimensional layout data of FIG. 6 includes some functional blocks such as RF circuit 11, RAM 12, analog circuit 13, ASIC 14, CPU 15, DSP 16 and flash memory 17. In order to divide the two-dimensional layout data of FIG. 6 into a plurality of layout block data, the two-dimensional layout data is preferably divided as shown by the bold line in FIG. 6 on the basis of a boundary area of the functional block. Interconnects disposed at the boundary area are equivalent to the global interconnects. In the case of FIG. 6, the two-dimensional layout data is divided into three layout block data using two partition lines. Thus, the two-dimensional layout data is divided into three layers. The position of the partition line 5 is not limited to FIG. 6.

When the procedure of step S12 in FIG. 3 ends, one of two layout block data divided by the partition line 5 is reversed to generate a new layout block (step S13). FIG. 4B shows an example in which the layout block data arranged on the second layer is reversed. Layout data obtained by reversing is shown as "B back". Incidentally, the layout block data A may be reversed in place of the layout block data.

The procedure of step S13 will be hereinafter described with reference to circuits shown in FIGS. 5A to 5C. The circuit on the upper side from the partition line 5 of FIG. 5A is arranged on the second layer. The layout block data B corresponding to the second layer circuit is reversed. In this case, the circuit is expressed as shown in FIG. 5B. In other words, FIG. 5B corresponds to the upper half circuit of FIG. 5A, and is provided as a line symmetry to the upper half circuit with respect to the partition line 5. Conversely, the first layer circuit is arranged without being reversed as seen from FIG. 5C.

The reason why only one of neighboring two layers is reversed is because interconnect position of neighboring two layers are vertically overlapped. For example, the second layer circuit shown in FIG. 5B has interconnects C1 to C12 connected to the under layer. These 12 interconnects are arranged so that they are vertically overlapped. In this way, it is possible to shorten the interconnecting part connecting the upper and under layers, and thus, to greatly reduce interconnect delay. In order to vertically overlap these 12 interconnects, layout block data of one of neighboring arranged two layers is reversed. Considering the foregoing matter, the layout block data is reversed in step S13 of FIG. 3.

When the procedure of reversing the layout data ends, interconnecting part connecting between layers is arranged (step S14). FIG. 4C is a schematic view showing the sectional structure of a three-dimensional semiconductor integrated circuit comprising two layers. As illustrated in FIG. 4C, an interconnecting part 8 connecting layers 6 and 7 is vertically arranged along the side of each interconnecting part. In this way the interconnecting part 8 is shortened to a length that is the sum of the interval between substrates and the thickness of each substrate.

The following methods are given a method of forming a three-dimensional circuit. One is a method of bonding substrates, and another is a re-growth process of Si crystal layer. Further, another is a method of stacking a material layer other than Si from a second layer using CVD process and sputtering. Therefore, there is a case where the second layer or the upper layer thereof is formed of a material different from Si substrate of the first layer. In the following description, the second layer or a succeeding layer is called a "substrate" for convenience.

Vertically arranged substrates 6 and 7 are jointed together via a bonding layer. Each of Substrates 6 and 7 has a thickness of 0.1 mm including the thickness of the bonding layer (e.g., epoxy bonding agent is given as a material). More specifically, the thickness of each substrate is about 60 to 70 μm if a bulk Si substrate is used as a material, and 2 to 3 μm if an SOI substrate is used as a material.

Each layout data of the substrates 6 and 7 formed in the foregoing step S13 is converted into mask data. Thereafter, a semiconductor integrated circuit is actually manufactured in the manufacturing process. The interconnecting part connecting substrates 6 and 7 is patterned and formed using conventional electroplating in such a manner that the side of substrates 6 and 7 is arranged horizontally. As seen from FIG. 4C, the interconnecting part 8 is formed on only part of the side. Thus, heat of substrates 6 and 7 is released from a portion having no interconnecting part 8. As a result, even if the interconnecting part 8 is formed, there is no possibility that heat release performance becomes worse.

If layout block data A and B of FIG. 4A have the same area, a two-dimensional area of the three-dimensional semiconductor integrated circuit comprising two layers A and B becomes half of the original circuit. Thus, the chip size is largely reduced.

FIGS. 7A to 8D are views to schematically explain the procedure by the three-dimensional layout data generation part 4. These FIGS. 7A to 8D show an example of converting two-dimensional layout data into three-dimensional layout data comprising four layers. FIGS. 7A to 7D show the case of stacking four layout block data A, B, C and D in the two-dimensional layout data in the order of A→B→C→D. FIGS. 8A to 8D show the case of stacking four layout block data A, B, C and D in the two-dimensional layout data in the order of A→D→C→B.

In the case of FIGS. 7A to 7D, the three-dimensional layout data generation part 4 divides the two-dimensional layout data into four layout block data A, B, C and D. Thereafter, the generation part 4 generates layout data in which layout block data B and D are reversed, and then, vertically overlaps these four data in the order of A→B→C→D.

In the case of FIGS. 8A to 8D, the three-dimensional layout data generation part 4 divides the two-dimensional layout data into four layout block data A, B, C and D. Thereafter, the generation part 4 generates layout data in which layout block data C and D are reversed, and then, vertically overlaps these four data in the order of A→D→C→B.

In any cases of FIGS. 7A to 8D, the interconnecting part 8 connecting each substrate is patterned and formed along the side of each substrate using electroplating. Interconnection between substrates may be made using wire bonding.

As shown in FIGS. 7A to 8D, the two-dimensional layout data is divided into four layout block data, and thereafter, overlapped each other. In this way, the original two-dimensional circuit is reduced to a ¼ two-dimensional area of the original circuit; therefore, the chip size is largely reduced.

Whether any of FIGS. 7A to 8D is employed determines depending on a critical path position in the two-dimensional layout data. The critical path indicates an important signal path (e.g., system clock signal path) having a large timing limitation. There is a need of making circuit arrangement so that the critical path becomes shortest. Therefore, if the critical path is arranged according to a path of A→B→C→D, it is desirable that FIGS. 7A to 7D is employed. Moreover, if the critical path is arranged according to a path of A→D→C→B, it is desirable that FIGS. 8A to 8D is employed.

The order of vertically arranging four layout block data A, B, C and D may be considered otherwise than FIGS. 7A to 8D. For this reason, the arrangement order of each layer is determined considering the foregoing critical path, the interconnection length of the interconnecting part 8, power consumption, and degree of generation of heat and noise.

For example, the interconnecting part of the layers is provided on the outside of the layers; for this reason, heat is easy to be emitted outside. Therefore, the interconnecting part apt to generate heat is to be extended to two layers as possible as can. Conversely, the interconnecting part sensitive to noise is to be collectively arranged in the same layer.

Suppose a semiconductor integrated circuit comprising a plurality of three-dimensionally arranged substrates is accommodated in the same package. In this case, each substrate is preferably set to the same size. However, the layout block data arranged on each substrate is not always set to the same size. In this case, the size of each substrate is preset in accordance with the layout block data having the maximum area.

Substrates 6 and 7 are connected each other via the interconnecting part 8 of the side of these substrates. Thus, interconnects of substrates 6 and 7 connecting to the interconnecting part 8 must be extended to the side. For this reason, there is a possibility that the interconnection becomes long as compared with two-dimensional layout. However, difficult timing signal lines such as critical path are arranged in one layer as far as possible, or arranged in two layers close to each other. In this way, timing disadvantage is prevented.

The three-dimensional layout data generation part 5 may comprise any of hardware and software. If the generation part 5 is used as software using a CAD tool, the CAD tool divides the two-dimensional layout data, and reverses the divided layout block data. In this case, the layout block data obtained by division may be temporarily stored in a memory device. Moreover, layout block data previously generated by other apparatus may be acquired via a network or recording medium such as CD-ROM, and thereafter, the procedure of reversing the data may be taken. As described above, the three-dimensional layout data generation part 4 may be composed of one hardware or software, or composed in cooperation with a plurality of hardware and software.

According to the foregoing description, the two-dimensional layout data is divided along the global interconnects to generate layout block data. In this case, other method of generating the layout block data is considered. For example, FIGS. 9A to 9C show an example that a functional block is divided using an interconnect between standard cells as partition line. A bold line dividing RAM 12, ASIC 14 and DSP 15 of FIG. 9A is a partition line 5. In these divided functional blocks, the partition line 5 is arranged between neighboring cells.

If the interval between divided cells is narrow as shown in FIG. 9B, the interval between cells may be widened as shown in FIG. 9C, when the layout data is divided into blocks.

The material of the interconnecting part 8 is not specially limited; in this case, it is particularly effective to use a carbon nanotube. The carbon nanotube serves to improve conductivity as compared with Cu and Al. Moreover, the carbon nanotube has property of making a connection between different two layers in self-organization. Thus, it is possible to form the interconnecting part 8 having a micro width without carrying out complicated manufacturing processes.

According to the foregoing configuration, the two-dimensional layout data is divided into a plurality of layout block data. Part of the layout block data is reversed, and then, each layout block data is arranged on plural substrates. Therefore, it is possible to fully use the two-dimensional layout data, and to manufacture a three-dimensional integrated circuit capable of greatly reducing a two-dimensional area. In other words, it is possible to manufacture a three-dimensional integrated circuit using a simple method without taking special cost and time with respect to manufacture and development.

However, according to the foregoing prior invention, circuit delay time in the conventional two-dimensional design drawing is merely taken over. Thus, this does not directly contribute to improvement in circuit performance. On the other hand, when actual length distribution of circuit interconnects is investigated, it is experientially observed that long interconnects are about 10% in the whole of interconnects. The long interconnects limits circuit delay time; for this reason, the long interconnect only be reduced. However, in a two-dimensional circuit, it is impossible to avoid long interconnects even if optimization is made using various method. Moreover, as seen from a known document (Jpn. J. Appl. Phys Vol. 40(2001) pp 3032-3027), it is technically difficult to uniformly form many vias. Therefore, it is very difficult to manufacture a structure in which many via interconnects are formed adjacently, as a practical use product considering the circuit yield.

In view of the foregoing problem, according to this embodiment, when a circuit arrangement drawing (layout drawing) is created, elements are arranged so that interconnection delay of a target logic circuit becomes the minimum. This is carried out using a CAD, and it is usually called P & R. According to this operation, elements connected by the interconnect part are arranged so that they become close as possible as can. The circuit is usually complicated; for this reason, interconnects are provided all over an area close to the whole of the chip. However, such long interconnects are less than about 10%; therefore, these long interconnects only are connected using vias. In this way, it is possible to realize a three-dimensional integrated circuit faster than in the optimized P & R of two-dimensional circuit and has a small area using the two-dimensional layout. Considering the cost of designing vias, the number of vias may be limited to less than 10, though depending on a circuit.

According to this embodiment, part 3a and part 4a are newly added as seen from FIG. 1. Part 3a extracts the longest interconnect from the optimized two-dimensional interconnect in the order of the long interconnect. This process is realized using a conventional and two-dimensional layout drawing method.

According to the second to eighth embodiments described later, when the two-dimensional drawings is three-dimensionally folded, a position of via connecting between pins of neighboring long interconnects is determined. In a folding process, a folded portion is reversed on a computer for a CAD creating a layout like the prior invention. The via position is determined so that the foregoing long interconnect becomes as short as possible. In addition, the via position is determined so that no rearrangement of other circuit is required, or the rearrangement becomes the minimum. This is equivalent to the procedure of the part 4a of FIG. 1. Through the foregoing design process, the layout of each layer of the three-dimensional circuit drawing and the via position is determined. In this case, preferably, interconnect to be connected by via includes a so-called critical path.

The cost is taken to form the via; for this reason, the three-dimensional integrated circuit design method of this embodiment is used as the following. First, the number of vias is determined. If the via exist more than two, the longer interconnect is extracted in the order of long interconnect based on information obtained by the part 3a of FIG. 1. For example, if only one via is used, a way to fold the two-dimensional layout data shortening the long interconnect is selected. In this case, if the interconnect length is not so changed according some kinds of folding methods, the second longer interconnects are vertically positioned to be adjacent to each other.

Whether or not any of FIGS. 7A to 7D and 8A to 8D is employed is determined depending on a position of the second longer interconnect of the two-dimensional layout data.

Therefore, for example, if the second longer interconnect is arranged in the path of A→B→C→D, FIGS. 7A to 7D is preferably employed. Moreover, if the second longer interconnect is arranged in the path of A→D→C→B, FIGS. 8A to 8D is preferably employed. This is employed when the via is more than two. For example, if the via is three, a design is made so that the third longer interconnect is folded to be arranged in neighboring layer.

According to the foregoing configuration, the two-dimensional layout data is divided into a plurality of layout block data. Part of the layout block data is reversed, and then, each layout block data is arranged on plural substrates. Therefore, it is possible to fully use the two-dimensional layout data, and to manufacture a three-dimensional integrated circuit capable of greatly reducing a two-dimensional area. In other words, it is possible to manufacture a three-dimensional integrated circuit using a simple method without taking special cost and time with respect to manufacturing and development.

In addition, the long delay interconnect is rearranged through the via connecting upper and under layers. In this way, it is possible to reduce the length of the longer interconnect, and to improve circuit performance. In this case, the number (about one digit) of extremely slight vias is provided without forming many vias. Therefore, it is possible to prevent an increase in the cost of forming vias at the minimum.

In the layouts drawings of the following second to eighth embodiments, interconnects only provided with via are shown. Thus, in the following drawings, although block, module, global interconnect, local interconnect, normal circuit components and interconnects are omitted, they actually exist.

Second Embodiment

FIGS. 10A to 10C are view to explain a second embodiment, and to show a via located position when the layout data is folded in two. This embodiment is equivalent to the process of the part 4a of FIG. 1, and relates to a method of determining a via position in a long interconnect.

FIG. 10A is an original two-dimensional optimized circuit layout. A bold line 21 connecting between A and B drawn on the center of the drawing is assumed as the longest interconnect in the layout drawing. In this case, A and B represent two partial circuits connected by the longest interconnect. As described above, in the two-dimensional circuit layout, there happens necessarily interconnection arranged over an area close to the whole of the layout, even if the best optimization is carried out.

The circuit is configured into a folded structure shown in FIG. 10B using a dotted line L1 of FIG. 10A as a folding line. In FIG. 10, a portion including a circuit part A is an upper layer a, and a portion including a circuit part B is an under layer b. Circuit parts A and B on both ends of the longest interconnect 21 shown in FIG. 10A almost vertically overlap with each other. Therefore, use of a via to this portion makes the interconnect limiting a speed of the whole of the circuit short; therefore, circuit performance is largely improved.

Interlayer interconnects other than the above-mentioned via are made at the portion of the folding line L1 according to the same method as the prior application. The under layer b is designed so that the layout including the circuit part B shown in FIG. 10A is reversed on a CAD.

In this case, the folding line L1 is not always positioned on the center of the layout drawing as shown in FIG. 10A. Further, A and B in FIG. 10 are substantially shown at the same vertical position, but the vertical position of A and B may be shifted.

And then, a second longest interconnect is searched, and thereafter, the same process is repeated. The repeat number is determined in accordance with a required circuit area. If a structure having three layers or more is formed, a via may be provided between layers which are not adjacent.

According to the second embodiment, the two-dimensional circuit layout is folded at the folding line L1 to make a three-dimensional circuit layout. Therefore, it is possible to design a three-dimensional integrated circuit using a simple method without spending excessive manufacturing and development cost and taking long time. The longest interconnect 21 connecting circuit parts A and B is arranged so that it vertically overlaps in a three-dimensional circuit layout, and these A and B are connected by the via. In this way, it is possible to design an excellent performance three-dimensional integrated circuit, which reduces long interconnect.

The second embodiment is intended to shorten the long interconnecting part using the via. Thus, the number of interconnects rearranged using the via is preferably about 30% or less in the whole of the interconnect. The second embodiment is more effective in longer interconnects, and especially effective to long interconnects having long delay time.

Third Embodiment

FIGS. 11A to 11D are views to explain a third embodiment of the present invention, and shows a method of determining a via position.

Figure 11D:
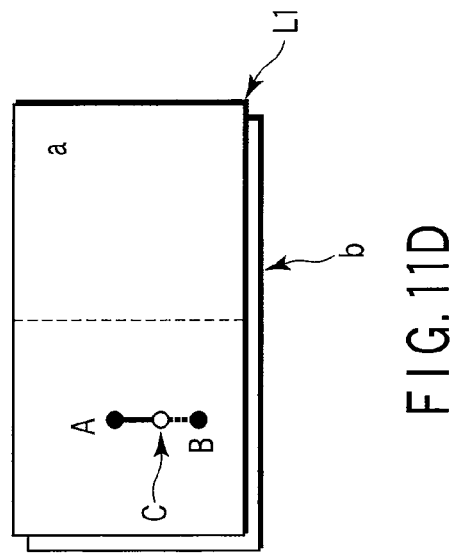
FIGS. 11A to 11D are views to explain a third embodiment, and views showing via layout positions when the layout data A and B are folded in two.
Figure 11B:
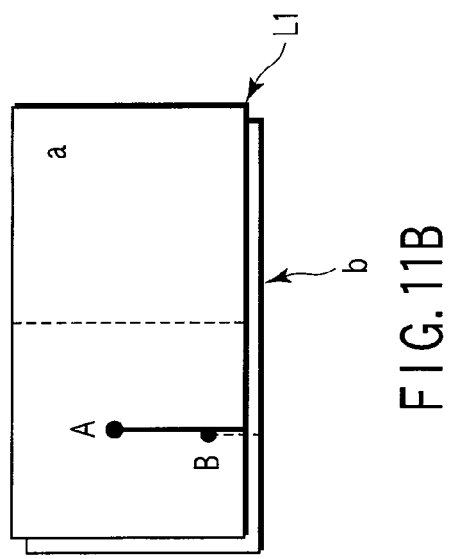
Figure 11C:
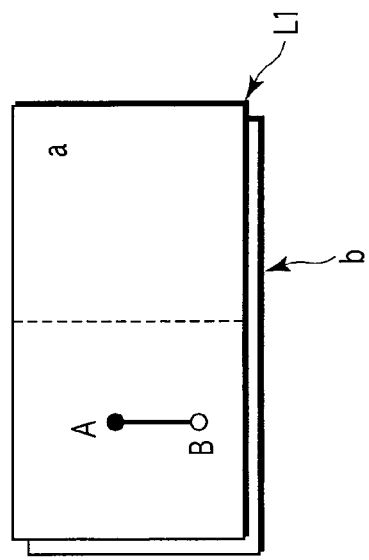
Figure 11A:
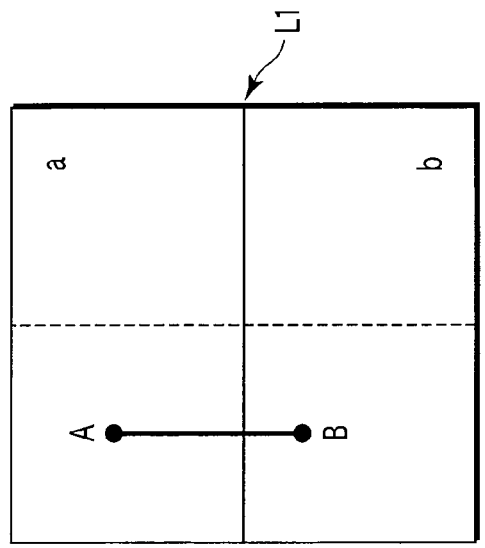

In FIGS. 11A to 11D, A and B show two pins connected by a long interconnect in a circuit. In this case, a two-dimensional drawing shown in FIG. 11A is vertically folded at a folding line L1. FIG. 11B is a schematic view folded at the folding line L1. The circuit is divided into two layers, that is upper and under layers a and b. In this case, the folded interconnect partially overlaps in the upper and under layers. Therefore, the via position is set at a pin B shown in FIG. 11C.

In the case of FIG. 11C, it is assumed that there is no circuit part which cannot move to a place corresponding to the pin B on the upper layer a. If there exists a circuit part, which cannot move to the via position shown on upper layer of the drawing, the via position is moved to a position C as shown in FIG. 11D.

Fourth Embodiment

FIGS. 12A to 12G are views to explain a fourth embodiment of the present invention, and shows the case where a long interconnect ranges over original two-dimensional three faces when a three-dimensional circuit is formed.

First, a two-dimensional layout drawing shown in FIG. 12a is folded at a folding line L1 as shown in FIG. 12B. In this case, a position shown by "C" of FIG. 12B is candidate making a first via structure. If there exists an unmovable circuit on the layer a, a via position may be shifted. FIG. 12C shows the case where the via is formed at a position C.

As depicted in FIG. 12D, attention is given to a layer b. In FIG. 12D, the layer a is omitted for easy understanding. The next folding line is a line L2 shown in FIG. 12D. The layout drawing is folded at the line L2; as a result, a layout drawing shown in FIG. 12E is obtained. In FIG. 12E, pin positions B and C are so shifted that a via connecting two layers is set to a pin position shown in FIG. 12F. In this case also, if there exists a circuit, which cannot move to the position on a layer, a via position may be shifted.

According to the fourth embodiment, a three-dimensional circuit comprising four layers is finally formed as seen from FIG. 12G. The circuit is partially or fully folded, and another long interconnect is connectable using a via. In FIG. 12G, the interval between layers is widely shown to be ready seen. Interconnects other than the via connecting between layers are schematically shown along the edge of the circuit.

In FIG. 12G, the distance between layers is emphatically shown. In fact, circuit speed is increased by three-dimensional formation if the sum of the via length from a2 to b2 and the interconnect length in a2 and b2 is less than the interconnect length of the original two-dimensional circuit diagram. Moreover, in many cases, the via is thicker than the two-dimensional interconnect. Thus, interconnect delay from a2 to b2 is less than two-dimensional interconnect delay.

According to the fourth embodiment, the two-dimensional layout is folded at the folding line L1, and further, folded at the line L2. In this way it is possible to form a three-dimensional circuit layout, and to design a three-dimensional integrated circuit using a simple method without spending excessive manufacturing and development cost and taking longer time. In the two-dimensional circuit layout, one long interconnect connects, using the via, interconnects provided on different layers a2, b1 and b2. In this way, it is possible to design an excellent performance three-dimensional integrated circuit, which reduces longer interconnects.

Fifth Embodiment

FIGS. 13A to 13D are views to explain a fifth embodiment of the present invention, and show the case where the first longest interconnect A1-B1 and the second longest interconnect A2-B2 are connected through respective vias.

Figure 13C:
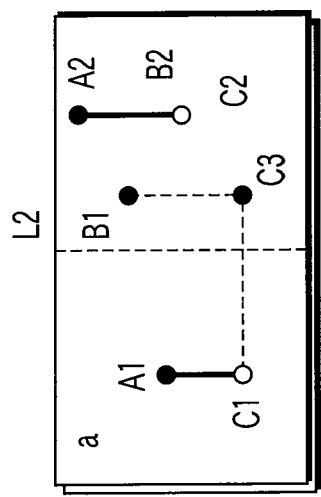
FIGS. 13A to 13D are views to explain a fifth embodiment, and views showing via layout positions when the layout data A and B are folded in four.
Figure 13B:
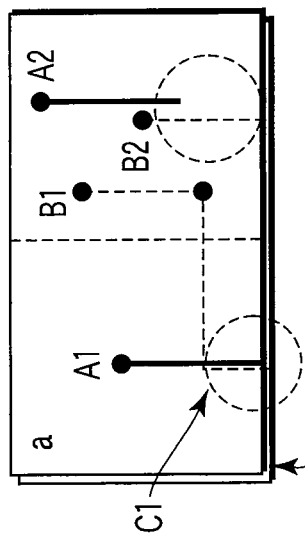
Figure 13D:
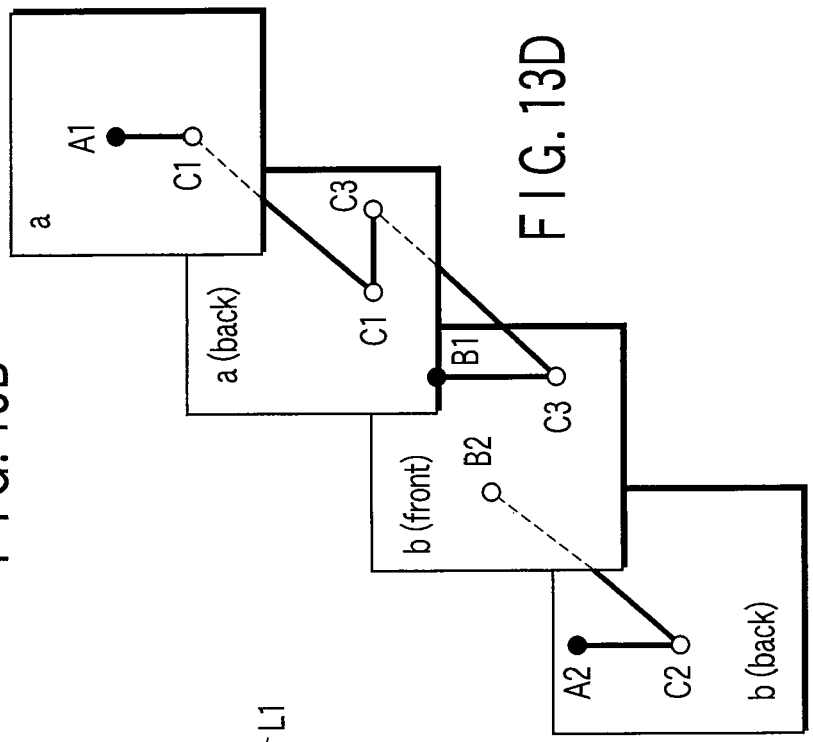
Figure 13A:
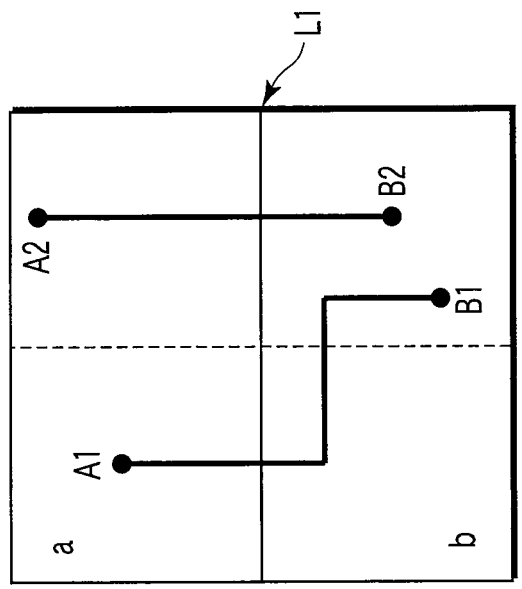

A two-dimensional drawing shown in FIG. 13A is vertically folded at a folding line L1 as shown in FIG. 13B. The interconnect A1-B1 vertically overlaps, and the interconnect A2-B2 vertically overlaps. Therefore, as illustrated in FIG. 13C, a structure of connecting the interconnect connecting A1 and B1 using a via C1 is provided. Moreover, a structure of connecting the interconnect connecting A2 and B2 using a via C2 is provided. In this case also, the interconnects partially overlapped between two layers serve to shorten the interconnect length using the vias.

If a circuit area is further reduced, layers a and b are further folded to obtain a four-layer structure. In FIG. 13D, the distance between layers is shown in a separated manner to be readily seen. In FIG. 13, interconnects other than vias connecting between layers are not shown.

Sixth Embodiment

FIGS. 14A to 14D are views to explain a sixth embodiment of the present invention, and show the case where the present invention is applied to two interconnects.

A two-dimensional layout drawing shown in FIG. 14A is folded at a folding line L1 as shown in FIG. 14B. A via C1 can be formed in an interconnect A1-B1 while a via C2 is formed in an interconnect A2-B2 at a portion surrounded by a doted circle.

As depicted in FIG. 14C, the layout drawing is folded at a folding line L2, so that a new via can be formed in the interconnect A1-B1. FIG. 14D shows via C3 formed to connect the second and third layers.

Seventh Embodiment

FIGS. 15A to 15D are view to explain a seventh embodiment of the present invention. FIGS. 15A to 15D show the case where an interconnect P1-P5 is obliquely arranged with respect to the periphery of a layout drawing unlike FIGS. 11A to 11D and 14A to 14D. As seen from FIGS. 15A to 15D, the present invention is applicable even if a two-dimensional interconnect is complicatedly arranged in a circuit.

Figure 15C:
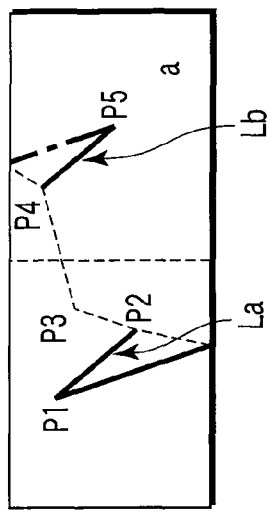
FIGS. 15A to 15D are views to explain a seventh embodiment, and to show via layout positions when interconnects are arranged inclined to the layout peripheral.
Figure 15D:
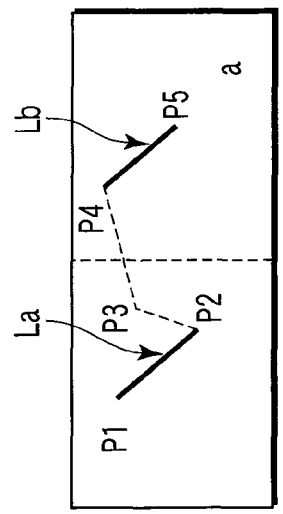
Figure 15A:
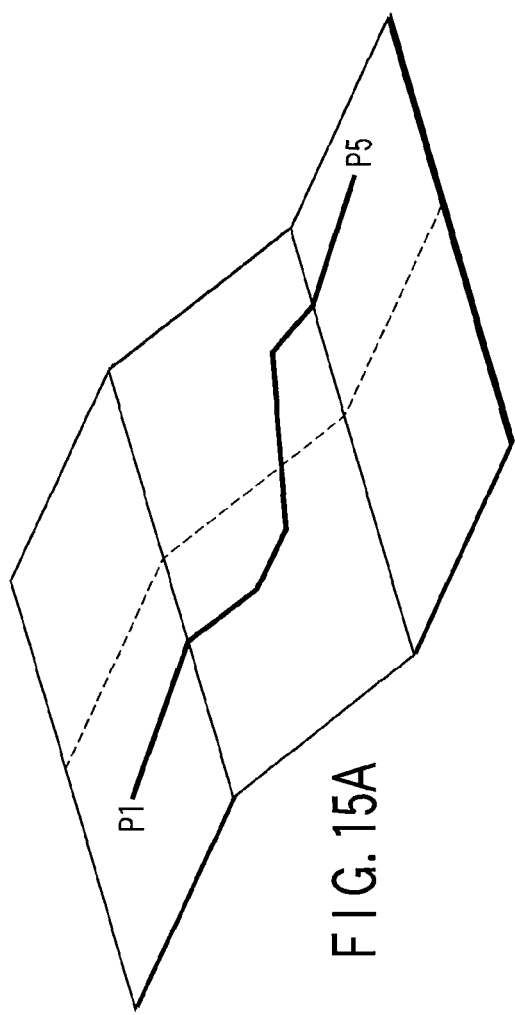
Figure 15B:
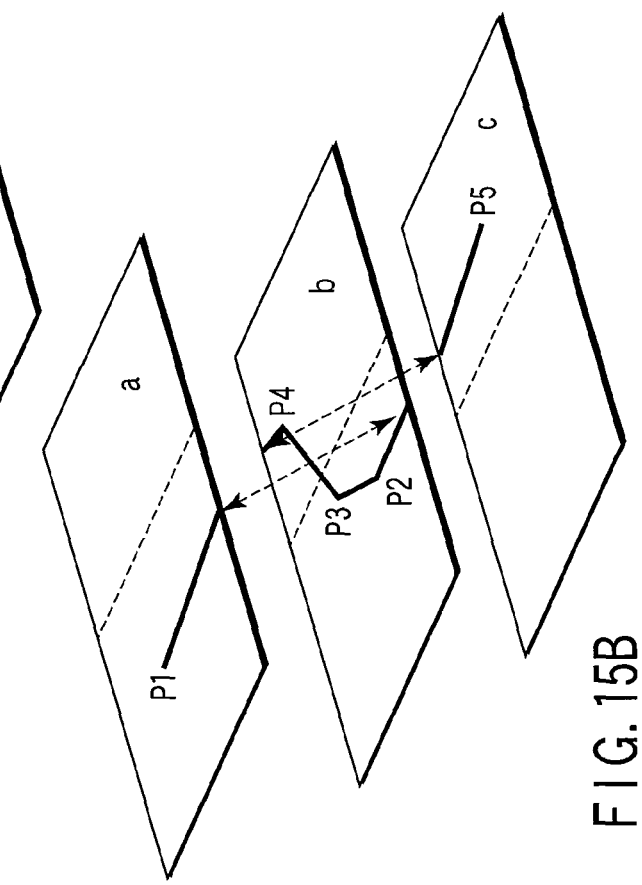

First, a two-dimensional drawing shown in FIG. 15A is folded as shown in FIG. 15B so that an intermediate b layer layout is reversed. FIG. 15C is a top plan view showing a state of interconnects given when the layout drawing shown in FIG. 15B is folded. In FIG. 15C, the interconnect does not overlap each other between different layers. According to the seventh embodiment, as shown in FIG. 15D, interconnects La and Lb are newly formed to connect an interconnect P1-P2 and P4-P5. Each position P2 and P4 is provided with a via. In this way, interconnects are connected between upper and under layers, and the interconnect is shortened.

According to the seventh embodiment, a new interconnect is provided with respect to the interconnect obliquely arranged in the periphery of the two-dimensional circuit layout. In this way, the interconnects are connected between upper and under layers using the via. In this case, the interconnect rearranged using the via becomes short as compared with the length on the original two-dimensional layout, and thereby, the interconnect length is reduced.

Eighth Embodiment

FIGS. 16A to 16C are views to explain an eighth embodiment of the present invention, and show a bonded substrate.

As shown in FIG. 16A, a substrate 50 is formed in such a manner that the back and front surfaces of a Si substrate 51 are covered with insulating films 52 and 53 such as $SiO_2$. A substrate 60 is formed in such a manner that a front surface of a Si substrate 61 is covered with an insulating film such as $SiO_2$. The above substrates 50 and 60 are bonded with the insulating films 52 and 62 facing each other. In this way, a bonded substrate 100 shown in FIG. 16B is formed. Vias 54 are buried in the substrate 50 and vias 64 are buried in the substrate 60 as well.

As shown in FIG. 16C, the bonded substrate 100 shown in FIG. 16B is folded on the bonded substrate to shorten a long interconnecting part. Although no illustration is given in FIG. 16C, the method of folding the substrate is the same as described in FIGS. 11A to 11D and 15A to 15D. In FIG. 16, the substrate is folded in two; in this case, the substrate is foldable in three layers or more like the embodiments described in FIGS. 11A to 11D and 15A to 15D.

As described above, the two-dimensional layout data is divided into a plurality of parts using the interconnecting part in the circuit as a boundary. One of neighboring divided data is reversed on data. In a three-dimensional integrated circuit design made so that divided partial data is each given as one layer, a design is made using a method of bonding neighboring layers.

Modification Example

The present invention is not limited to the foregoing embodiments. In all embodiments, the folding line is not always given on the center of the layout drawing. Upper and under interconnects are shown at the same position in the upper and under layers by folding, but the interconnect position may be shifted between upper and under layers. Likewise, some pin positions are shown at the same position in upper and under layers, but the position may be shifted between upper and under layers.

In the embodiments, the longest interconnect is connected using the via, but the longest interconnect may not be used as a target. For example, if the longest interconnect complicatedly distributes, the second longest interconnect may be found to make connection using the via. Moreover, long delay interconnect may be selected in place of the long interconnect in length. For example, the interconnects of a processor and a memory may be three-dimensionally connected through vias.

In the foregoing embodiments, the interconnect connected using the via is shown one or two only. In this case, the same process is repeated with respect to three or more interconnects. The repeat number of processes finally determines in accordance with a required circuit area. If a structure comprising three or more layers is formed, the vias may be used between layers, which are not adjacent to each other.

FIGS. 13A to 14D show the method of shortening two interconnects using the via. The present invention is applicable to the case of three interconnects. In this case, when the folding line is given, preferably, between blocks, between modules (FIG. 6) or at global interconnecting part (FIG. 9B) as described in the prior application. This results from the following reason. Specifically, if the layout drawing is folded between blocks, between modules or at global interconnecting part, the number of interconnects connected to the end of layers according to the method of the prior application is reduced, and further, the process is simply carried out.

In the embodiments, the via structure is used with respect to the longest interconnect and interconnect delay. Even if the interconnect delay is not long, interconnects may be connected using the via structure as the necessity arises.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of designing a three-dimensional integrated circuit, comprising:
   designating, in a computer, a plurality of partition lines dividing two-dimensional layout data of a circuit to be formed on a semiconductor substrate into a plurality of layout block data in order to re-arrange in different layers, each of the plurality of layout block data including data of a semiconductor circuit;
   generating, in the computer, reversed layout block data reversing of one of two layout block data adjacent to each other among the plurality of layout block data by reversing the one of the layout data symmetrically with respect to a specified partition line among the plurality of partition lines;
   arranging, in the computer, the reversed layout block data and the other of the two block layout data to form two layers vertically stacked assuming with the semiconductor substrate interposed therebetween;
   selecting, in the computer, at least one pair of interconnects included in a the two layout block data of the circuit, ranging over the two layers, and mutually and functionally relating, with respect to at least one of time delay, interconnect length and block configuration; and
   re-arranging, in the computer, the at least one pair of interconnects selected using a via connecting an upper one and an under one of the interconnects.

2. The method according to claim 1, wherein said re-arranging the at least one pair of interconnects selected using the via includes setting a total length of the interconnects after re-arrangement to be short as compared with an interconnect length on an original two-dimensional layout drawing.

3. The method according to claim 1, wherein said re-arranging the at least one pair of interconnects selected using the via includes setting a total length of the interconnects to be short as compared with an interconnect length of an original two-dimensional layout drawing.

4. The method according to claim 1, wherein said re-arranging the at least one pair of interconnects selected using the via includes arranging an original two-dimensional layout drawing so as to partially overlap between the two layers stacked.

5. The method according to claim 1, wherein said designating a plurality of partition lines dividing two-dimensional layout data includes designating a partition line along a global interconnect portion shared by a plurality of layout blocks corresponding to the layout block data.

6. The method according to claim 1, wherein said designating a plurality of partition lines dividing two-dimensional layout data includes dividing and classifying the two-dimensional layout data in accordance with a circuit function to designate the partition lines.

7. The method according to claim 1, wherein said designating a plurality of partition lines dividing two-dimensional layout data includes leaving an internal interconnect in one of the layout block data without ranging over the plurality of layout block data.

8. The method according to claim 1, wherein the semiconductor circuit includes at least one circuit selected from the group consisting of a logic circuit, a radio-frequency (RF) circuit, a random-access-memory (RAM) circuit, an analogue circuit, an application-specific integrated circuit (ASIC), a CPU, and a flash memory.

9. An apparatus for designing a three-dimensional integrated circuit, comprising:
   a block dividing part dividing two-dimensional layout data of a circuit to be formed on a semiconductor substrate into a plurality of layout block data in order to re-arrange in different layers, each of the layout block data including a semiconductor circuit;
   a reverse data generation part generating reverse layout block data by reversing one of the two layout block data among the plurality of layout block data symmetrically with respect to a specified partition line;
   a three-dimensional layout generation part alternately stacking the plurality of layout block data divided by the block dividing part and the reverse layout block data generated by the reverse data generation part to a plurality of vertically overlapped layers; and
   a re-arrangement part selecting at least one pair of interconnects which are included in a plurality of layout block data of the circuit, range over plural layers, and so as to mutually and functionally relate with respect to at least one of time delay, interconnect length and block configuration, and short-circuiting the pair of interconnects selected using a via connecting an upper one and an under one of the selected interconnects.

10. The apparatus according to claim 9, wherein the re-arrangement part sets a length of the interconnect after re-arrangement to be short as compared with an interconnect length of an original two-dimensional layout drawing.

11. The apparatus according to claim 9, wherein the rearrangement part sets an effective length of the interconnect to be short as compared with an original two-dimensional layout drawing.

12. The apparatus according to claim 9, wherein the rearrangement part arranges part of an original two-dimensional layout drawing to overlap between the two layers stacked.

13. The apparatus according to claim 9, wherein the block dividing part divides the layout block data along a global interconnect portion shared by a plurality of layout blocks corresponding to the layout block data.

14. The apparatus according to claim 9, wherein the block dividing part divides and classifies the layout block data in accordance with a circuit function.

15. The apparatus according to claim 9, wherein the block dividing part divides an internal interconnect in the layout block without ranging over a plurality of layout blocks.

16. The apparatus according to claim 9, wherein the semiconductor circuit includes at least one circuit selected from the group consisting of a logic circuit, a radio-frequency (RF) circuit, a random-access-memory (RAM) circuit, an analogue circuit, an application-specific integrated circuit (ASIC), a CPU, and a flash memory.

* * * * *